United States Patent
Bazes et al.

[11] Patent Number: 5,991,339
[45] Date of Patent: Nov. 23, 1999

[54] ADAPTIVE EQUALIZATION USING A MINIMUM-JITTER CRITERION

[75] Inventors: Mel Bazes; Rafi Ben-Tal, both of Haifa, Israel

[73] Assignee: Intel Corporation, Santa Clara, Calif.

[21] Appl. No.: 09/008,050

[22] Filed: Jan. 16, 1998

[51] Int. Cl.[6] ................................................... H03H 7/30
[52] U.S. Cl. ............................ 375/232; 708/323; 333/18
[58] Field of Search .................................. 375/229, 232; 333/18; 708/323

[56] References Cited

U.S. PATENT DOCUMENTS

| | | | |
|---|---|---|---|
| 4,985,900 | 1/1991 | Rhind et al. | 375/232 |
| 5,323,423 | 6/1994 | Townsend et al. | 375/232 |
| 5,809,072 | 9/1998 | Zortea et al. | 375/232 |

Primary Examiner—Temesghen Ghebretinsae
Attorney, Agent, or Firm—Kenyon & Kenyon

[57] ABSTRACT

An adaptive equalizer is implemented using digital feedback control and using jitter as the adjustment criteria. An adjustable transfer function is implemented to equalize an input signal to enhance the frequency response of the associated system. Jitter is determined for the filtered signal, and the frequency response of the transfer function is varied accordingly by applying a digital adjustment signal to the transfer function structure (for example, a lead-lag filter). The adaptive equalizer can thereby adapt to various transmission medium lengths and signal degradation levels.

25 Claims, 12 Drawing Sheets

ADAPTIVE EQUALIZATION USING A MINIMUM-JITTER CRITERION

BACKGROUND INFORMATION

The frequency spectrum of a signal is typically degraded as it passes through a transmission medium, such as a cable. This is a concern, for example, in the implementation of local area networks (LANs), which may require signals having large bandwidths to be transmitted over various distances. This is particularly true in the 100BASE-TX Fast Ethernet LAN protocol, which requires at least 70 MHZ of bandwidth for undistorted transmission through the network at the desired data rate of 100 Mb/s. This degradation usually takes the form of attenuation of the high-frequency components of the signal's frequency spectrum. As a result of this degradation, narrow signal pulses have lower peak amplitudes than wide pulses, causing difficulty in recovering the bit information encoded in each pulse.

To compensate for frequency degradation, a processing technique called cable equalization is often performed, which restores the attenuated frequency components almost completely back to their former amplitudes. FIG. 1 illustrates this concept. An ideal signal (s(t)) has its frequency spectrum degraded (i.e., its high-frequency components are attenuated) as a result of passing through a transmission medium. The degraded signal ($s_d(t)$) is then restored through equalization to produce a restored signal ($s_e(t)$). Once the signal has been restored, it may then be processed by other downstream components, for example, a clock and data recovery circuit, in a conventional manner.

A further result of frequency spectrum degradation is signal "jitter," i.e., signal transitions do not occur at multiples of a fixed time interval but, rather, at multiples of a varying time interval. Jitter reduces the ability to recover data from the signal. One way of observing this reduction in the ability to recover data is to observe the signal "eye pattern." A signal eye pattern is obtained by using an oscilloscope to observe the signal while triggering the oscilloscope trace with the signal itself.

FIG. 2 illustrates the eye patterns that would be obtained for the three waveforms of FIG. 1 (s(t), $s_d(t)$ and $s_e(t)$). For the best sampling of a signal, the sampling transition should be located in the center of the eye, which provides maximum setup and hold times for signal sampling. As can be seen from FIG. 2, the eye of the signal exiting the transmission medium ($s_d(t)$) is practically closed. Thus, recovering data from this signal would be practically impossible since little or no setup and hold times are available for reliable sampling by the sampling clock. On the other hand, the signal eye for the signal resulting from equalization ($s_e(t)$) is practically completely open, thereby restoring the large setup and hold times needed for reliable sampling by the sampling clock.

Often the characteristics of the transmission medium are allowed to vary significantly while at the same time requiring good equalization. For example, if the transmission medium is a cable, the cable may be allowed to range in length from zero to 100 m, as is the case in 100BASE-TX Ethernet networks. Since short cable lengths tend to degrade a signal's frequency spectrum much less than long cable lengths, an equalizer designed for a short cable will generally under-compensate a long cable. Conversely, an equalizer designed for a long cable will over-compensate a short cable. In either case, the resulting signal may be unintelligible.

An "adaptive" equalizer solves this problem by automatically varying its characteristics ("adapting" its characteristics) as a function of the transmission medium characteristics. Thus, an adaptive equalizer produces an output signal that is optimized for any transmission medium that is within specified limits. FIG. 3 illustrates the block diagram of a prior art adaptive equalizer implementation. An input signal i(t) carried by a transmission medium is provided to a variable filter 302 whose characteristics are varied under feedback control. An output signal o(t) of variable filter 302 is input to a detector 304 which converts this signal into a restored waveform r(t).

The output signal o(t) of variable filter 302 is also provided to a summing element 306 in inverted form, and the restored signal r(t) is likewise provided to summing element 306. Thus, the output of variable filter 302 is subtracted from the output of detector 304 to generate an error signal e(t). This error signal e(t) represents the distortion in the restored signal r(t) caused by imperfect compensation by variable filter 302 of the input signal i(t) from the transmission medium. The error signal e(t) is provided to variable filter 302 such that the error signal e(t) modifies the characteristics of variable filter 302 in a direction that reduces the error.

This prior art implementation of an adaptive equalizer has several drawbacks. For example, the prior art adaptive equalizer requires that the amplitude and timing of the variable filter output be precisely controlled so that the error signal represents only true signal distortion. Without precise amplitude and delay control, the error signal would include false contributions from amplitude and timing differences between the variable filter output and the detector output. So this implementation requires using very precise analog techniques for operation.

Furthermore, the prior art adaptive equalizer implementation uses an amplitude criterion for adapting the filter, that is, it examines amplitude differences and generates an error signal based on these differences. However, the criterion that is of direct interest to the equalization process is not amplitude, but rather jitter, since jitter directly impacts the ability to accurately perform sampling. While, in theory, equalizing a signal's amplitude over all frequencies of interest is expected to result in minimum jitter, this might not necessarily be true for practical—and, therefore, imperfect—filter implementations.

SUMMARY OF THE INVENTION

An adaptive equalizer is implemented according to the present invention, comprising a variable filter, a detector, a clock and data recovery unit, and an adaptation control unit. The variable filter receives an input signal and applies an adjustable transfer function to this signal to produce a filtered signal. The detector receives the filtered signal and produces a decoded signal. The clock and data recovery unit receives the decoded signal and produces a recovered signal. The adaptation control unit receives the recovered signal and determines the jitter of the filtered signal to produce an adjustment signal. The adjustment signal is provided to the variable filter to affect an adjustment of the transfer function.

Additional embodiments of the adaptive equalizer according to the present invention may also be implemented, for example, the adjustment signal may be implemented as a digital signal, and the adjustment signal may be based on a transition data signal provided as part of the recovered signal. The transfer function may be implemented as a lead-lag filter having a variable resistor structure, such that the adjustment signal specifies the resistance value and thereby adjusts the frequency response of the transfer function. A symbol error detector may also be used.

DETAILED DESCRIPTION OF THE DRAWINGS

An implementation of a first exemplary adaptive equalizer according to the present invention is shown by FIGS. 4–10. As will become apparent from the following discussion, the exemplary adaptive equalizer does not require any precision amplitude or delay control whatsoever. Except for a variable filter and signal detector, the adaptive equalizer according to the present invention relies only on digital techniques for operation, and uses a minimum-jitter criterion for optimizing the variable filter response. Since minimum jitter is the true goal of equalization, the adaptive equalizer according to the present invention meets this goal better than prior art equalizer implementations. Furthermore, the adaptive equalizer according to the present invention provides relative ease of implementation with respect to prior art equalizers, coupled with high performance and robustness.

Figure 1:
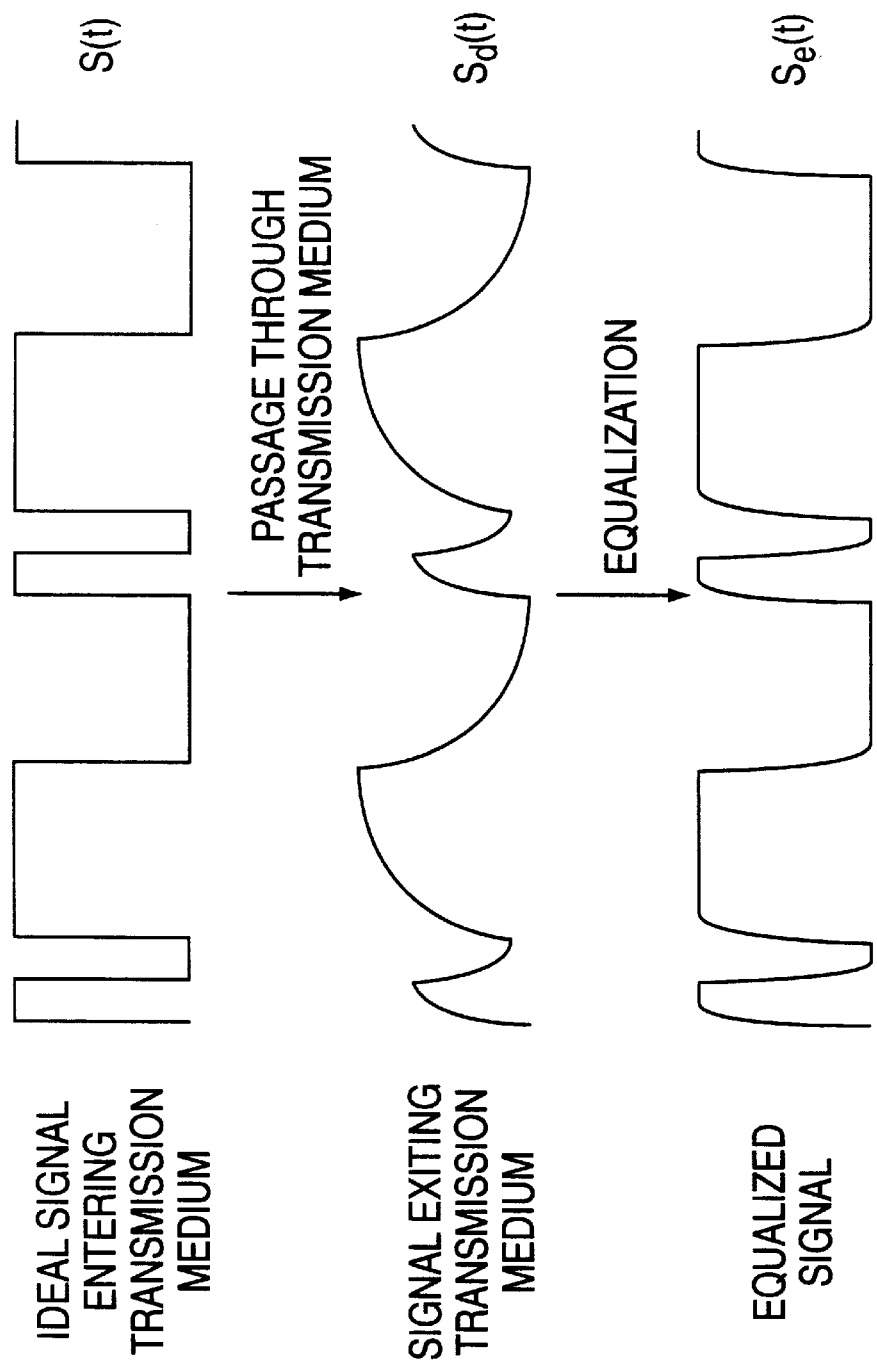
FIG. 1 shows a signal timing diagram of exemplary ideal, degraded and equalized signals.
Figure 2:
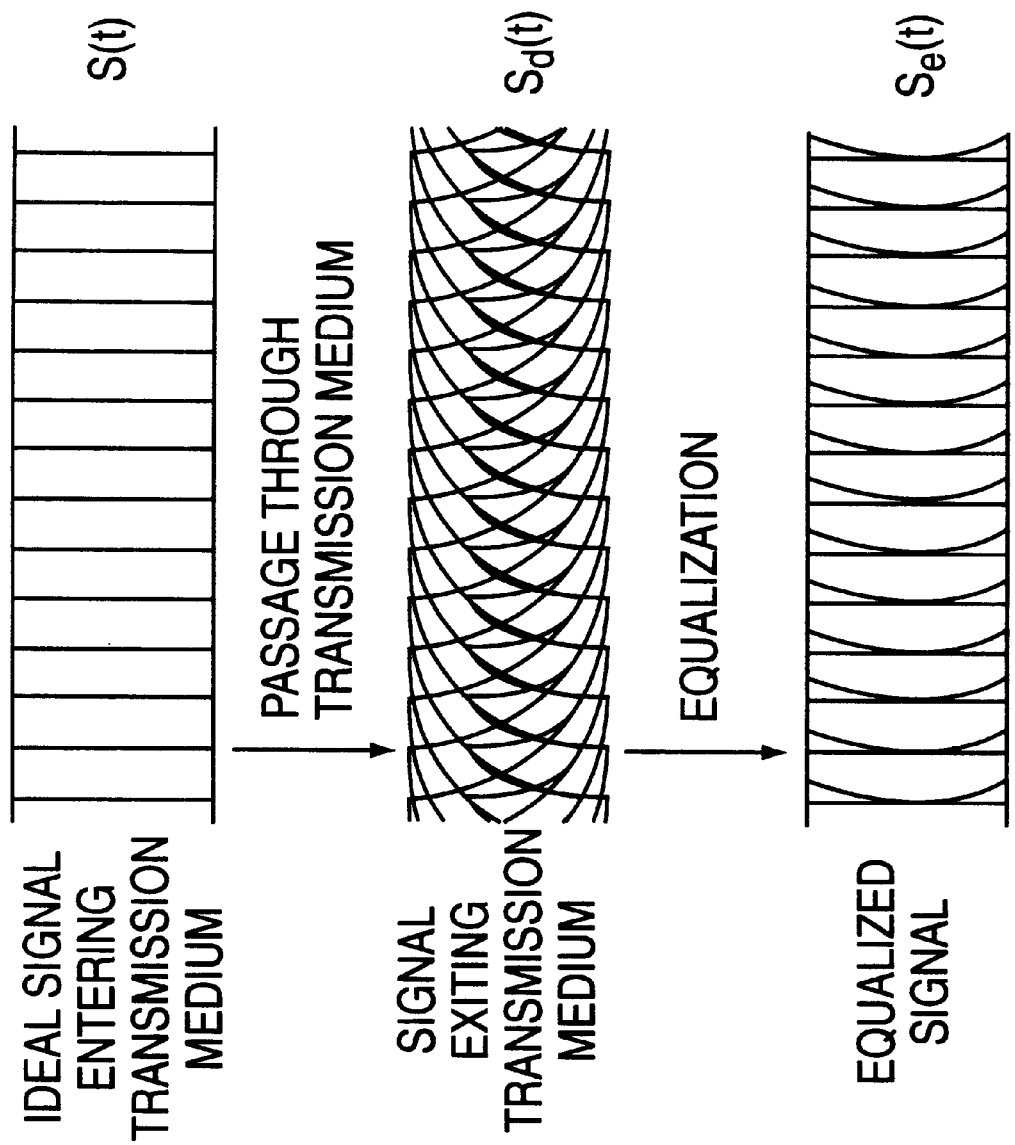
FIG. 2 shows signal eye patterns for the exemplary signals of FIG. 1.
Figure 3:
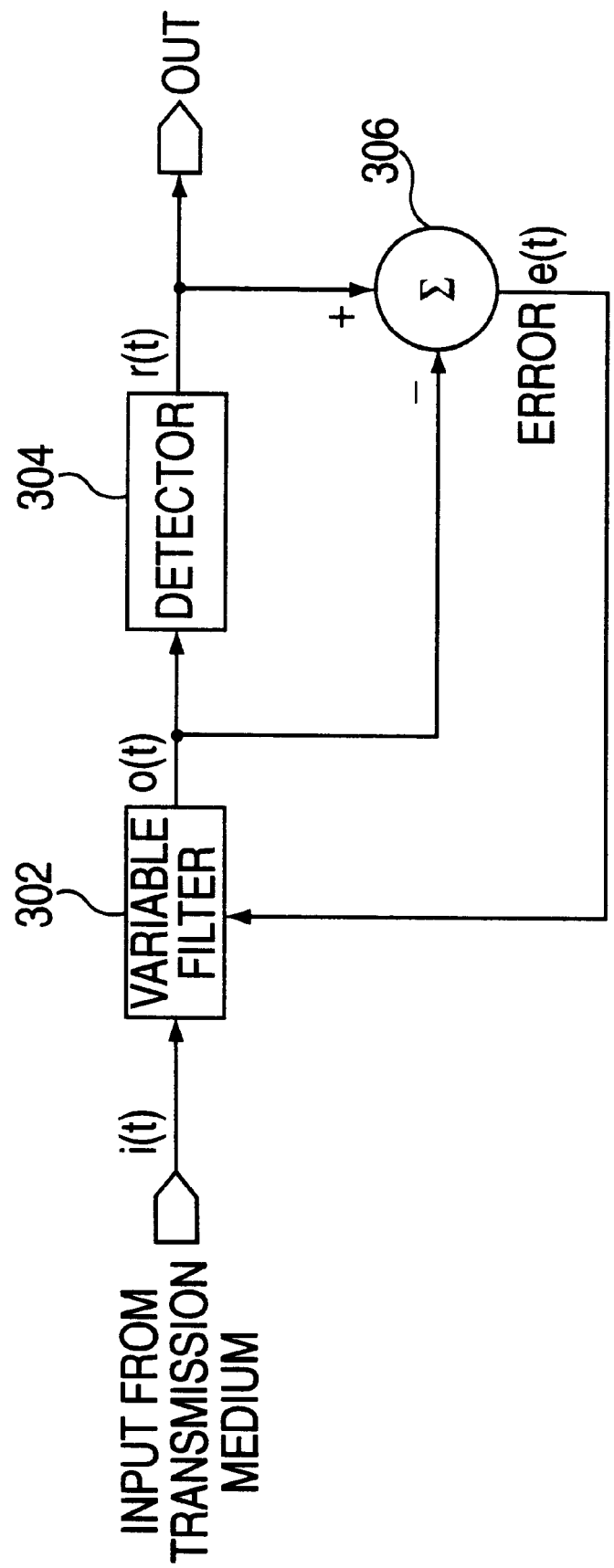
FIG. 3 shows a block diagram of a prior art adaptive equalizer implementation.
Figure 4:
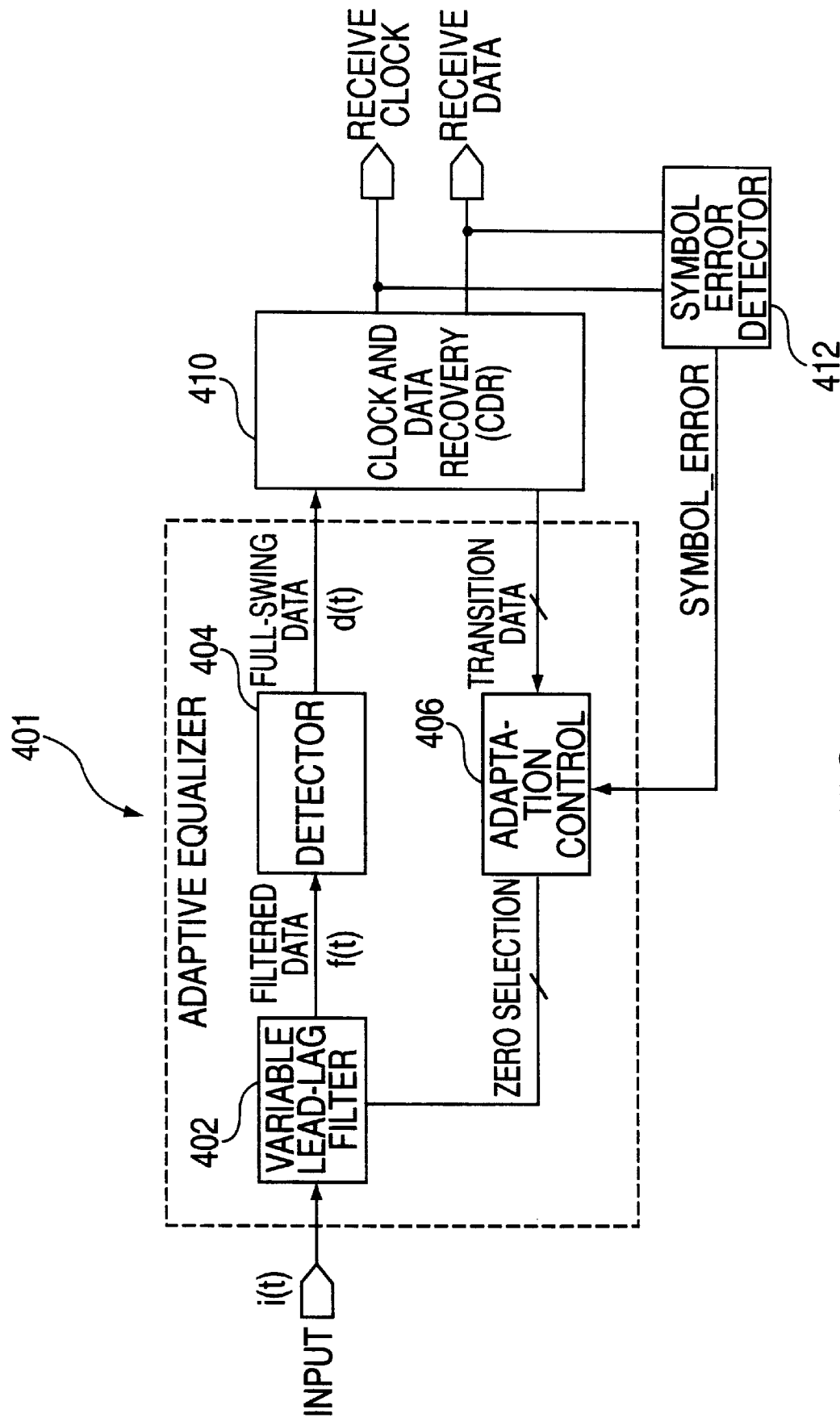
FIG. 4 shows a block diagram of a first exemplary embodiment of an adaptive equalizer according to the present invention.

FIG. 4 illustrates a block diagram of a first exemplary digital adaptive equalizer 401. The digital adaptive equalizer 401 consists of three basic blocks: (1) a variable filter 402; (2) a detector 404; and (3) adaptation control unit 406. An input signal i(t) is received by variable filter 402 from, for example, a transmission medium (e.g. a cable). The input signal i(t) is, for example, a multi-level differential signal, such as an MLT-3 signal. The output of variable filter 402, a filtered data signal f(t), is likewise a multi-level differential signal, which is provided to detector 404. The detector 404 converts the filtered data signal f(t) into a single-ended binary signal (e.g., a Non-Return-to-Zero-Invert-on-1 (NRZI) signal, or other full-swing pulse train signal) and produces a detector output signal d(t). Adaptation control unit 406 is coupled to the variable filter 402 to provide a zero selection signal (which is, for example, a digital signal) which can be used to adjust the parameters of variable filter 402 to better match the transmission medium characteristics (as is described further below).

Digitally-controlled adaptive equalizer 401 is coupled to a clock and data recovery block 410 (CDR), such that the detector output signal d(t) (derived from the input signal i(t)) is provided to CDR 410. CDR 410 is also coupled to the digitally-controlled adaptive equalizer 401 such that a transition data signal (which is, for example, a digital signal) is provided to the adaptive equalizer 401, and specifically to the adaptation control unit 406 (as described further below). The CDR 410 is implemented digitally, as is known from and described in, for example, U.S. Pat. No. 5,103,466, and "A Novel CMOS Digital Clock and Data Decoder," IEEE J. Solid State Circuits, vol. 27, no. 12, pp. 1934–1940 (December 1992), each of which is expressly incorporated herein by reference.

CDR 410 generates a recovered signal from the supplied detector output signal d(t). This recovered signal includes, for example, a receive clock signal and a receive data signal, each of which are themselves binary signals and, for example, Non-Return-to-Zero (NRZ) signals. The receive clock signal and receive data signal may be used by downstream network components (not shown) to extract the data encoded in input signal i(t). The recovered signal also includes, for example, the transition data signal, which contains transition data: information about the locations and number of transitions in each clock period (e.g. phase information) which is extracted from the detector output signal d(t). As previously mentioned, the transition data signal is provided to the adaptation control unit 406, which can then perform an average jitter determination, and cause the parameters of variable filter 402 to be varied accordingly until the average jitter is minimized, as described below.

A symbol error detector 412 may also be coupled to digital adaptive equalizer 401 and CDR 410 as shown in FIG. 4. Symbol error detector 412 determines whether the data carried by the receive data signal is valid at the bit level. Symbol error detector 412 decodes the received data and checks for illegal codes. In a 100BASE-TX network, for example, each encoded nibble of received data is be checked for an illegal code. If the symbol error detector 412 detects such an illegal code, it asserts a symbol error signal (SYMBOL_ERROR), which is provided to the adaptation control unit 406 of adaptive equalizer 401. This signal triggers the execution of an adaptation cycle (see below). As long as the symbol error signal is inactive, the digital adaptive equalizer 402 is assumed to be optimally adjusted and therefore no adaption cycle is required.

Variable Filter 402

Figure 5A:
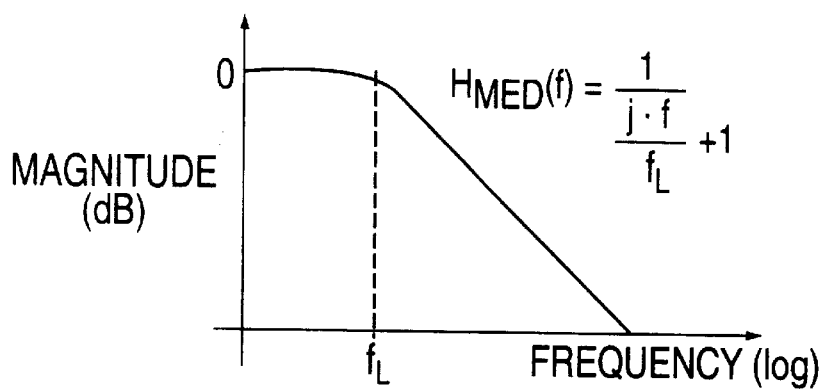
FIGS. 5(a)–(c) show frequency response graphs of an exemplary transmission medium, variable filter, and combined transmission medium/variable filter transfer function, according to the present invention.
Figure 5B:
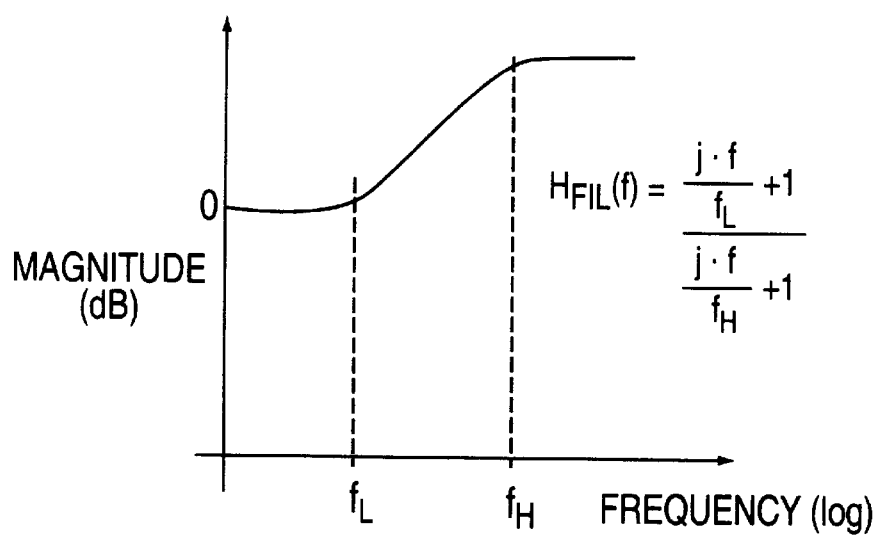
Figure 5C:
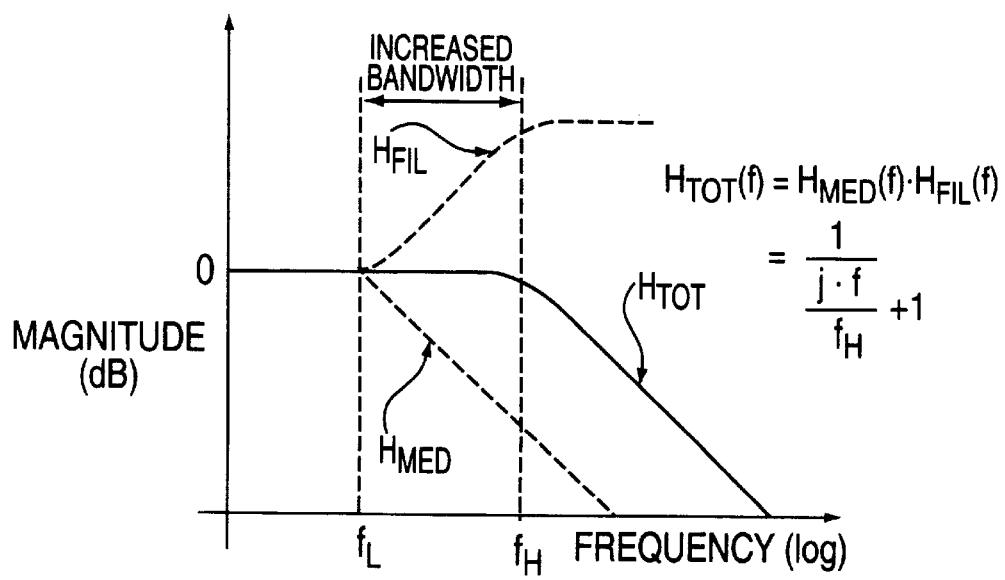

Variable filter 402 (implemented as, for example, a variable lead-lag filter) restores that portion of the frequency spectrum of input signal i(t) that is degraded as a result of passing through the transmission medium. FIGS. 5(a)–(c) illustrate the operation and characteristics of a first exemplary variable lead-lag filter 402, which represents a simplified (ideal) form. The transmission medium is modeled as a first-order low-pass filter with its pole at frequency $f_L$. Its frequency response appears in FIG. 5(a). The variable lead-lag filter 402 has a zero at frequency $f_L$ and a pole at frequency $f_H$. Its frequency response appears in FIG. 5(b).

Through the adaptation process, the zero of variable lead-lag filter 402 is made to coincide with the pole of the transmission medium. When this condition is achieved, the frequency responses cancel each other out, as shown by FIG.

5(c) for the combined transmission medium/variable lead-lag filter response. The combined transmission medium/variable lead-lag filter frequency response has its pole at $f_H$ instead of at $f_L$. Thus, the variable lead-lag filter 402 effectively increases the signal bandwidth from $f_L$ to $f_H$, and thereby restores the degraded frequency components up to the frequency $f_H$.

In practice, the actual transmission medium frequency response cannot be accurately modeled as a simple low-pass filter. In reality, the frequency response of a cable has the form of $$H(f) = Ae^{-k\sqrt{f}}$$

where A and k are complex coefficients. In order to compensate for this more complex frequency response, a more complicated compensation technique than simple pole-zero cancellation is required.

A second exemplary variable lead-lag filter 402 is implemented to account for the more complex transmission medium frequency response. In this implementation, several zeros and poles are arranged in such a fashion that the combination of the transmission medium and the filter has a relatively flat frequency response out to a sufficiently high frequency. The transfer function is implemented as two first-order lead-lag filters (i.e., each filter having a single pole and a single zero) connected in series. In this way, two zeros and two poles are implemented.

Figure 6:
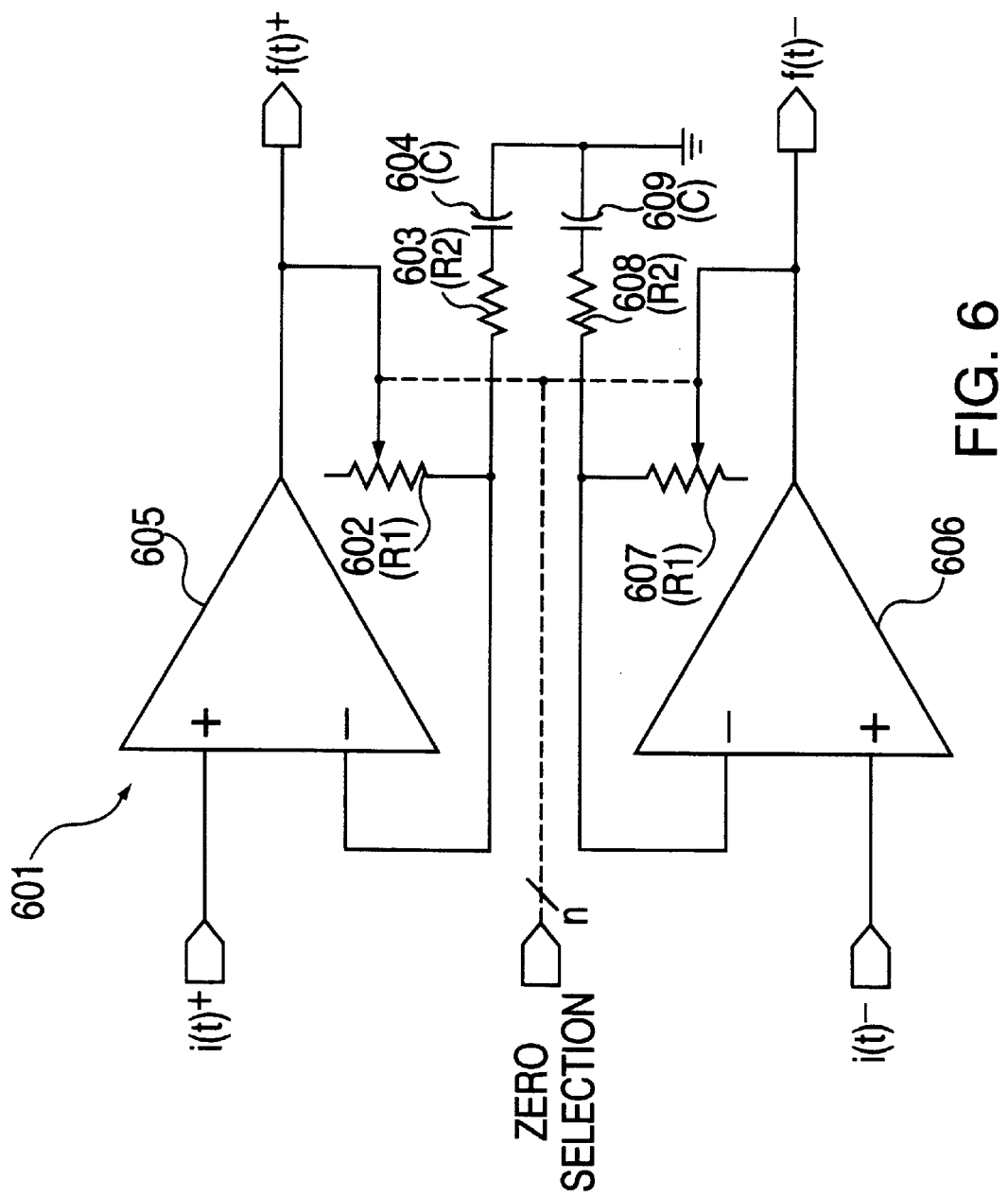
FIG. 6 shows a schematic diagram of one stage of a two-stage exemplary variable filter implementation according to the present invention.

FIG. 6 illustrates a schematic circuit diagram of one of the first-order lead-lag filter circuits used in variable filter 402. Each first-order filter circuit is similar, and therefore only the characteristics of first filter circuit 601 will be described in detail. First filter circuit 601 comprises a first operational amplifier 605 having a positive input coupled to receive a positive portion of a differential input signal (e.g. MLT-3). The first operational amplifier 605 also has a negative input coupled to resistors 602, 603 having resistances R1 and R2, respectively, and coupled to a capacitor 604 having capacitance C, as shown, in order to implement a known first-order filtering arrangement.

Filter circuit 601 also comprises a second operational amplifier 606, configured to mirror the first operational amplifier 605. A negative portion of the differential input signal is provided to the positive input of the second operational amplifier 606, and the negative input of the second operational amplifier 606 is coupled to resistors 607, 608 also having resistances R1 and R2 respectively, and a capacitor 609 also having a capacitance C. Resistors 602 and 607 (with resistance R1) are implemented as variable resistors to accomplish the equalizer adjustment function, as described below. The operational amplifiers can be implemented as a fully-complementary, self-biased, very-wide-common-mode-range differential amplifier, such as described in U.S. Pat. No. 4,958,133, and in "Two Novel Fully Complementary Self-Biased CMOS Differential Amplifiers," IEEE J. of Solid State Circuits, vol. 26, no. 2, pp. 165–168 (February 1991).

Filter circuit 601 as shown in FIG. 6 has the transfer function $$H_1(s) = \frac{1 + s/\omega_{z1}}{1 + s/\omega_{p1}}$$

where s is the complex frequency, $H_1(s)$ is the transfer function, $\omega_{Z1}$ is the transfer function zero and is given by $$\omega_{z1} = \frac{1}{(R1 + R2)C}$$

and $\omega_{P1}$ is the transfer function pole and is given by $$\omega_{p1} = \frac{1}{R2 \cdot C}$$

As previously stated, second exemplary variable filter 402 comprises two filter circuits 601 connected in series, in order to achieve two independent pole/zero combinations. The resulting complete transfer function H(s) for the complete variable filter 402 comprising first filter circuit 601 and second filter circuit 601 is given by $$H(s) = H_1(s) \cdot H_2(s) = \frac{1 + s/\omega_{z1}}{1 + s/\omega_{p1}} \cdot \frac{1 + s/\omega_{z2}}{1 + s/\omega_{p2}}$$

where $H_1(s)$, $\omega_{Z1}$ and $\omega_{P1}$ are produced by the first lead-lag filter circuit 601, and $H_2(s)$, $\omega_{Z2}$ and $\omega_{P2}$ are produced by the second lead-lag filter circuit 601.

Figure 7:
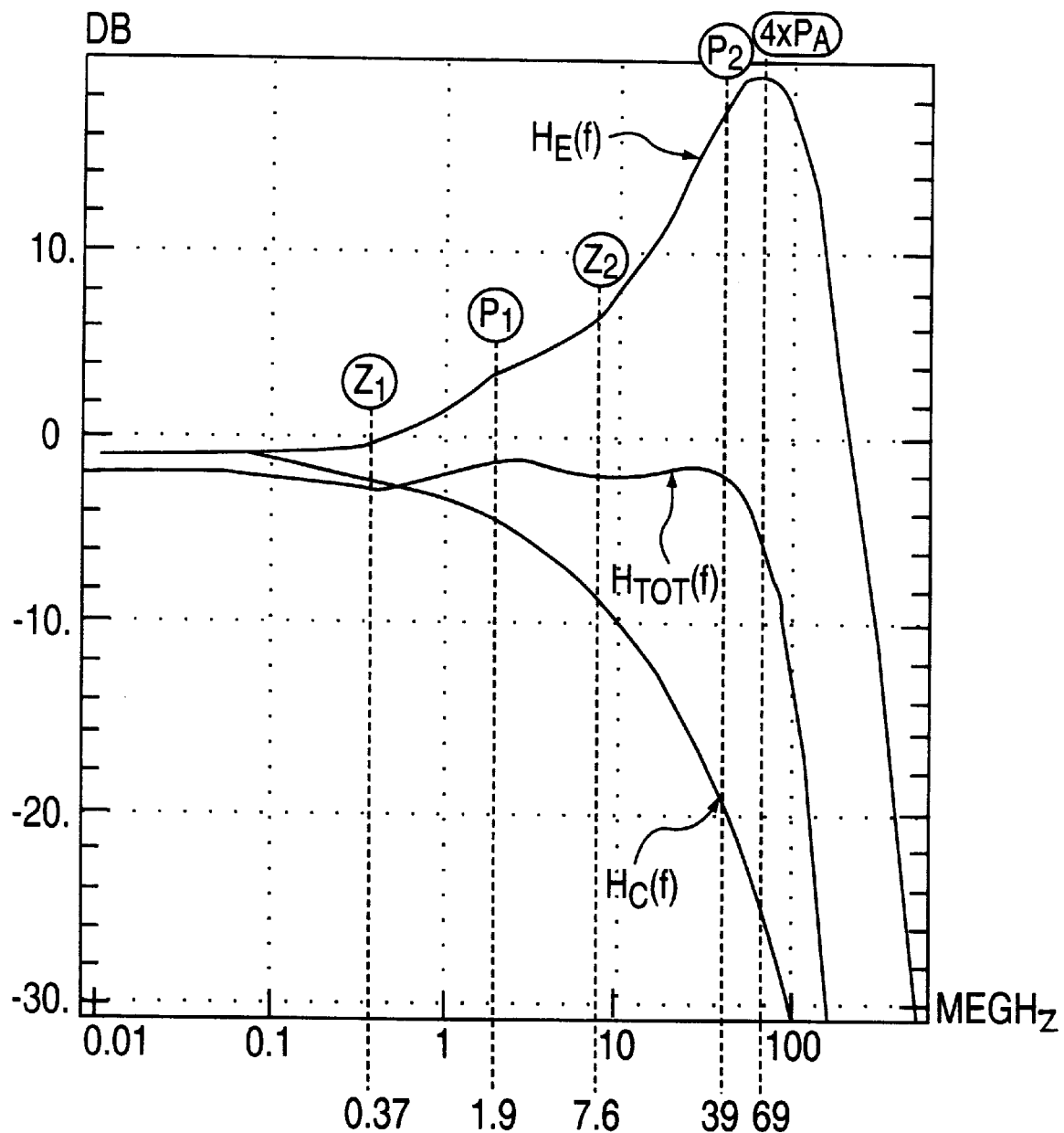
FIG. 7 shows a simulated frequency response graph of the two-stage exemplary variable filter, according to the present invention.
Figure 8:
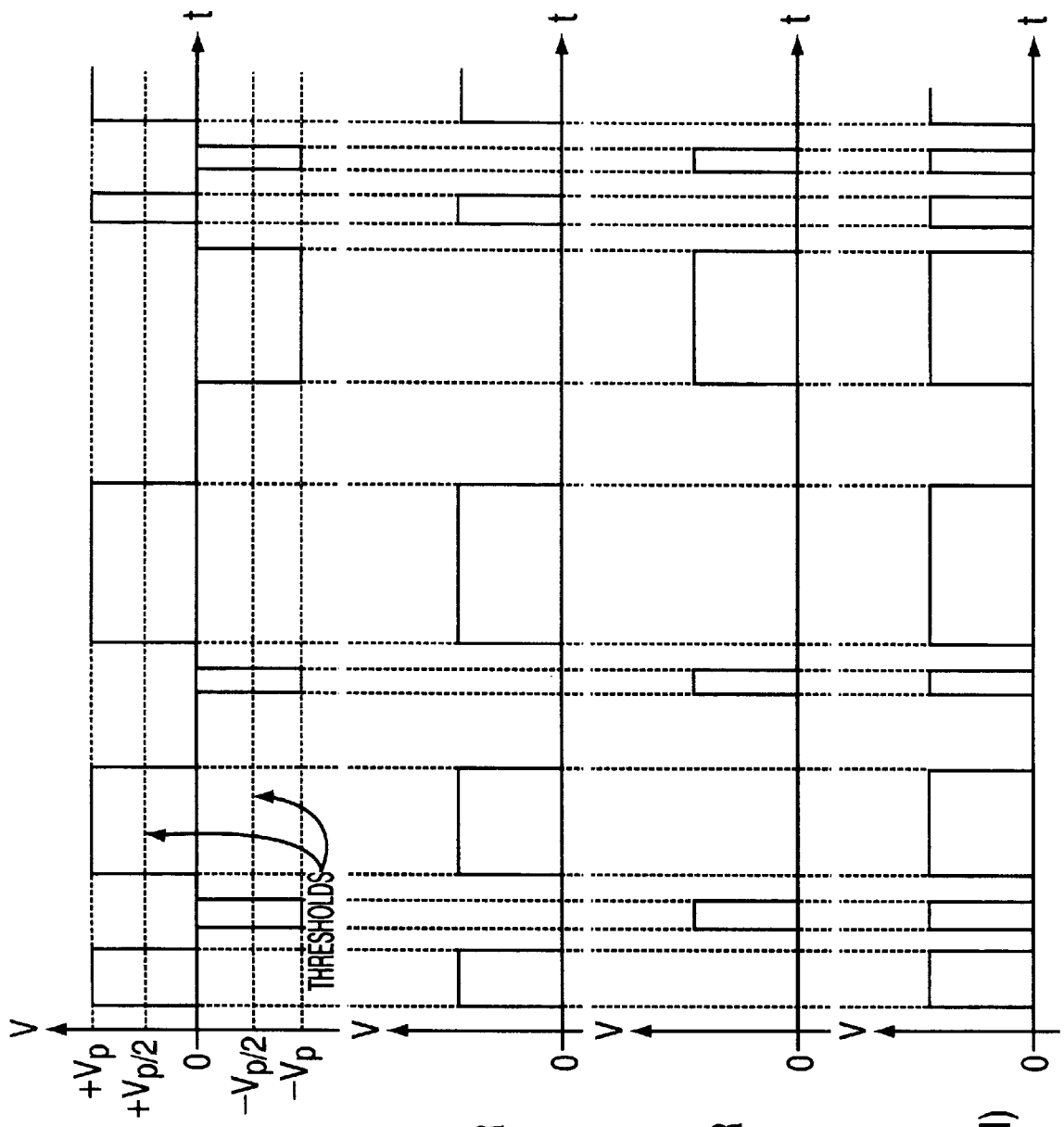
FIGS. 8(a)–(d) show signal timing diagrams of exemplary MLT-3 and NRZI signals, according to the present invention.

FIG. 7 illustrates a circuit simulation of the transfer functions of the cable ($H_C(f)$), adaptive equalizer ($H_E(f)$), and combined cable/equalizer transfer functions ($H_{TOT}(f)$) for a 125-m lowest-quality Category 5 unshielded twisted pair cable working with the second exemplary variable filter 402 of adaptive equalizer 401 under worst-case conditions. The transfer function zeros and poles are placed in such a way that the combined cable/equalizer transfer function is as flat as possible out to as high a frequency as possible. Accordingly, in this example $f_{Z1}$=0.37 MHZ, $f_{P1}$=1.9 MHZ, $f_{Z2}$=7.6 MHZ, and $f_{P2}$=39 MHZ. The resulting transfer function is relatively flat up to approximately 69 MHZ, at which point the amplifier gain-bandwidth product is exceeded, and $H_{TOT}(f)$ thus drops off sharply.

The resistors with resistance R1 are implemented as digitally-adjustable variable resistors, such that their values may be set according to an applied digital signal. The zero selection signal provided by adaptation control unit 406 is applied to these resistors in order to dynamically set their respective resistance values according to the jitter determinations of the adaptation control unit 406. As shown by the above equations, variation of the resistance value R1 produces variation in the zero location of the transfer function H(s), but does not affect the location of the pole. Thus the location of either filter zero can be precisely selected via the digital zero selection signal.

Detector 404

The input signal to the adaptive equalizer is, in general, a multi-level differential signal, for example, an MLT-3 signal. The filtered data signal f(t) produced as the output of variable filter 402 is likewise, generally, a multi-level differential signal. Detector 404 receives this filtered data signal f(t) and converts the signal to a single-ended signal, for example an NRZI signal, which can be easily used by downstream network components.

Figure 9:
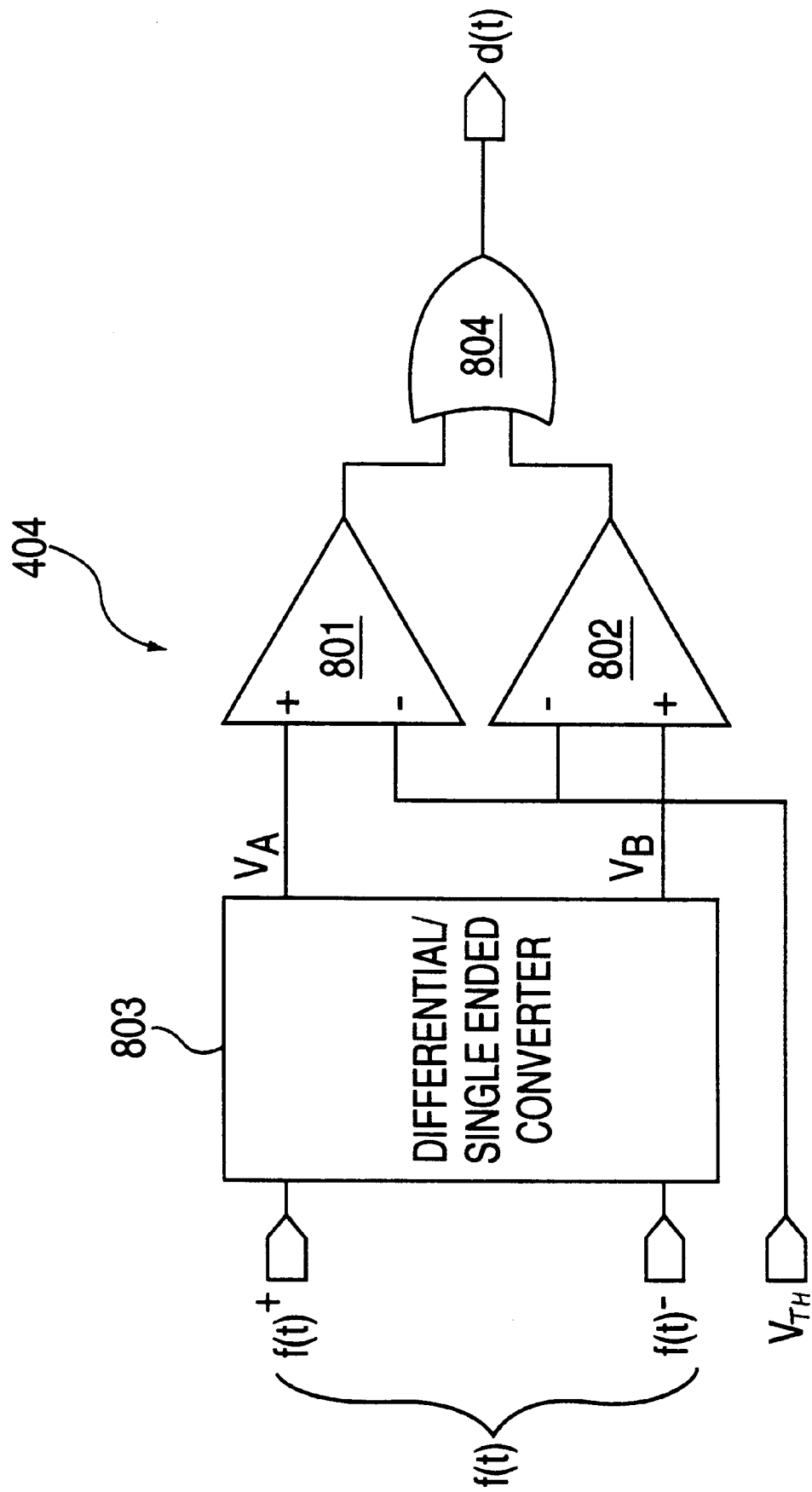
FIG. 9 shows a schematic diagram of an exemplary detector according to the present invention.

FIG. 9 shows a block diagram of an exemplary detector 404. Exemplary detector 404 as shown is implemented for use with an MLT-3 signal, although other signal types can be accommodated by standard modifications. The MLT-3 pulse code is a three-level differential pulse code which makes a transition wherever a "1" exists in the unencoded input data. FIG. 8(a) illustrates an exemplary MLT-3 waveform for filtered data signal f(t). The exemplary detector 404 comprises a differential/single-ended converter block 803 and two comparators 801 and 802. The differential/single-ended converter block 803, as is known to those with skill in the art, converts the differential signal f(t) into two complementary single-ended signals $V_A$ and $V_B$. In the absence of "baseline wander" (see below), $V_A$ and $V_B$ have the same peak voltages, as shown in FIGS. 8(b) and 8(c). A detailed description of an example of a differential/single-ended converter implementation is provided in the U.S. patent application Ser. No. 08/764,720 entitled "Method and Apparatus for Detecting Differential Threshold Levels while Compensating for Baseline Wander" (filed Dec. 10, 1996), which is expressly incorporated herein by reference.

The signals $V_A$ and $V_B$ are applied to inputs of comparators 801 and 802, respectively, along with a threshold voltage $V_{TH}$. The threshold voltage $V_{TH}$ of comparators 801 and 802 is set at $V_P/2$, where $V_P$ is the filtered data signal's peak differential voltage. The outputs of the comparators 801, 802 are then ORed together (OR gate 804) to provide the single-ended output signal d(t), which is an NRZI pulse code as shown in FIG. 8(d). Since both the MLT-3 and NRZI pulse codes make transitions wherever the input signal has a transition, the NRZI code contains exactly the same information encoded in the MLT-3 pulse code. However, whereas the MLT-3 code cannot be processed with conventional two-level logic, the NRZI code can be processed conveniently with conventional two-level logic as is generally implemented in downstream system components.

Detector 404 can also be implemented to be immune to "baseline wander," a condition that can cause peak voltages to vary between the positive ($V_A$) and negative ($V_B$) complementary signals. The implementation of such a detector is explained in the aforementioned U.S. patent application Ser. No. 08/764,720 entitled "Method and Apparatus for Detecting Differential Threshold Levels while Compensating for Baseline Wander" (filed Dec. 10, 1996).

Adaptation Control/Adaptation Control Unit 406

Figure 10:
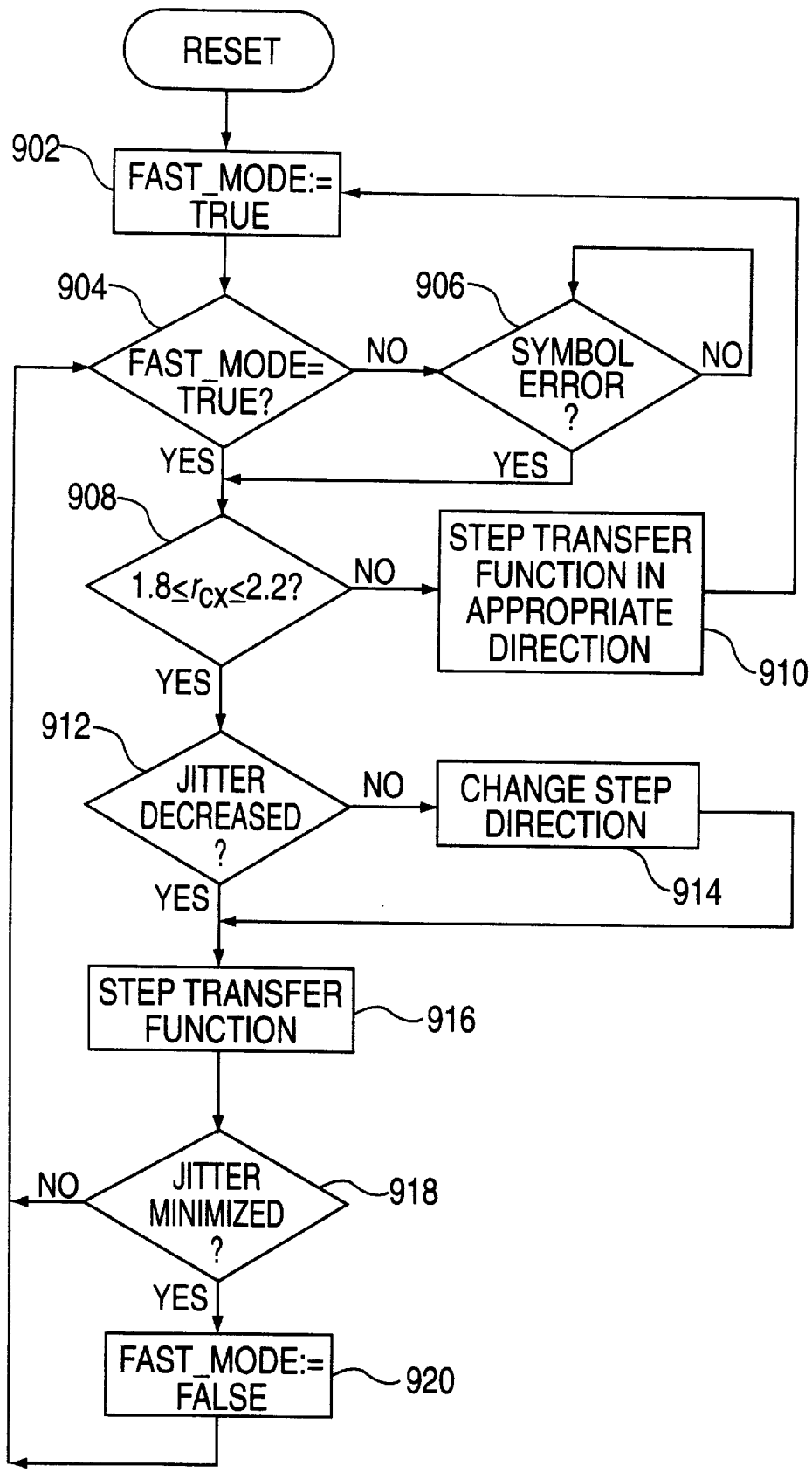
FIG. 10 shows a flow chart of an exemplary adaptation process according to the present invention.

The adaptation process, as performed by adaptation control unit 406, is represented in high-level form by the flow chart of FIG. 10. The process can be described with reference to two operational modes: fast mode and slow mode. The adaptation control unit 406 is initialized in fast mode (step 902), in order to initially set the transfer function zeroes to the correct values. Once the fast mode adjustment has been completed, the adaptation control unit 406 reverts to slow mode, which performs adaptation only when symbol errors are detected, as will be further explained below.

In slow mode, a logic unit that receives the recovered signal, for example, symbol error detector 412, checks for symbol errors in the recovered data stream (step 906). As long as there are no symbol errors, no action is taken, since the equalizer is assumed to be optimally adjusted. Adaptation is performed when, and if, a symbol error is detected. In this manner, the overall bit-error rate is reduced, because adjustments to the transfer function are only made when needed.

If the adaptation control unit 406 is in fast mode (step 904), or if the adaptation control unit 406 is in slow mode and a symbol error has been detected (step 906), the adaptation control unit 406 begins the adaptation process. The adaptation control unit 406 first checks whether the equalizer is within the normal operating range by checking the clock-to-transition ratio $r_{CX}$ of the recovered data (step 908). This ratio can be derived from the transition data provided to adaptation control unit 406 from CDR 410. For the exemplary implementation in a 100BASE-TX network, the encoding and scrambling techniques used therein generally result in an $r_{CX}$=2.0 on average. A significant deviation from this value indicates that the equalizer setting is too far away from its optimum value for adaptation to take place correctly.

When $r_{CX}$ significantly exceeds 2.0, transitions are being lost on account of excessive attenuation, and the equalizer transfer function zeros must be shifted to lower frequencies. When $r_{CX}$ is significantly less than 2.0, false transitions are occurring on account of excessive amplification, and the transfer function zeros must be shifted to higher frequencies. In such cases, the transfer function zeroes are stepped in the appropriate direction (step 910) and the adaptation control unit 406 is switched back into fast mode (step 902) to perform complete adjustment of the equalizer transfer function.

After $r_{CX}$ is verified to be within the normal operating range, the adaptation control unit 406 then optimizes the equalizer transfer function for minimum jitter. As part of this optimization, the signal jitter is checked by the adaptation control unit 406 (step 912). The jitter is averaged over a large number of transitions for accuracy. For example, the adaptation control unit 406 can average jitter over $2^{10}$ transitions=approximately $2^{11}$ clocks=16.4 $\mu$s (since $r_{CX}$=2.0 in this implementation, there are two clocks per transition, on average).

Initially, the variable filter transfer function is stepped one frequency unit via digital control by applying an appropriate zero selection signal to variable filter 402 (step 916). The initial direction of stepping can be, for example, either up or down. The adaptation control unit 406 then checks to see if the jitter has been minimized (step 918). Jitter is minimized if jitter worsens when a step in either direction is made. If the jitter is not determined to be minimized, the optimization process continues by rechecking the mode of operation (step 904), rechecking the clock-to-transition ratio (step 908), and checking to see if the previous frequency step resulted in jitter reduction (step 912). If the signal jitter was reduced by the previous frequency step, another one unit frequency step is applied (step 916) and the signal is again checked for minimum jitter (step 918). If the previous frequency step did not result in jitter reduction, then the direction of frequency stepping is changed (step 914), and the transfer function is then stepped by one frequency unit in the new direction (step 916).

Once minimum jitter has been determined, the equalizer transfer function is optimized and the adaptation process is then completed. The adaptation control unit 406 is then placed in slow mode (step 920) to monitor for symbol errors in the data stream.

A second exemplary embodiment of a digital adaptive equalizer according to the present invention will now be described, with specific reference to an implementation within a 100BASE-TX network. This exemplary embodiment has been commercially implemented in the 82555 Physical Interface chip and in the 82558 Ethernet Controller chip sold by Intel Corporation, Santa Clara, Calif.

Figure 11:
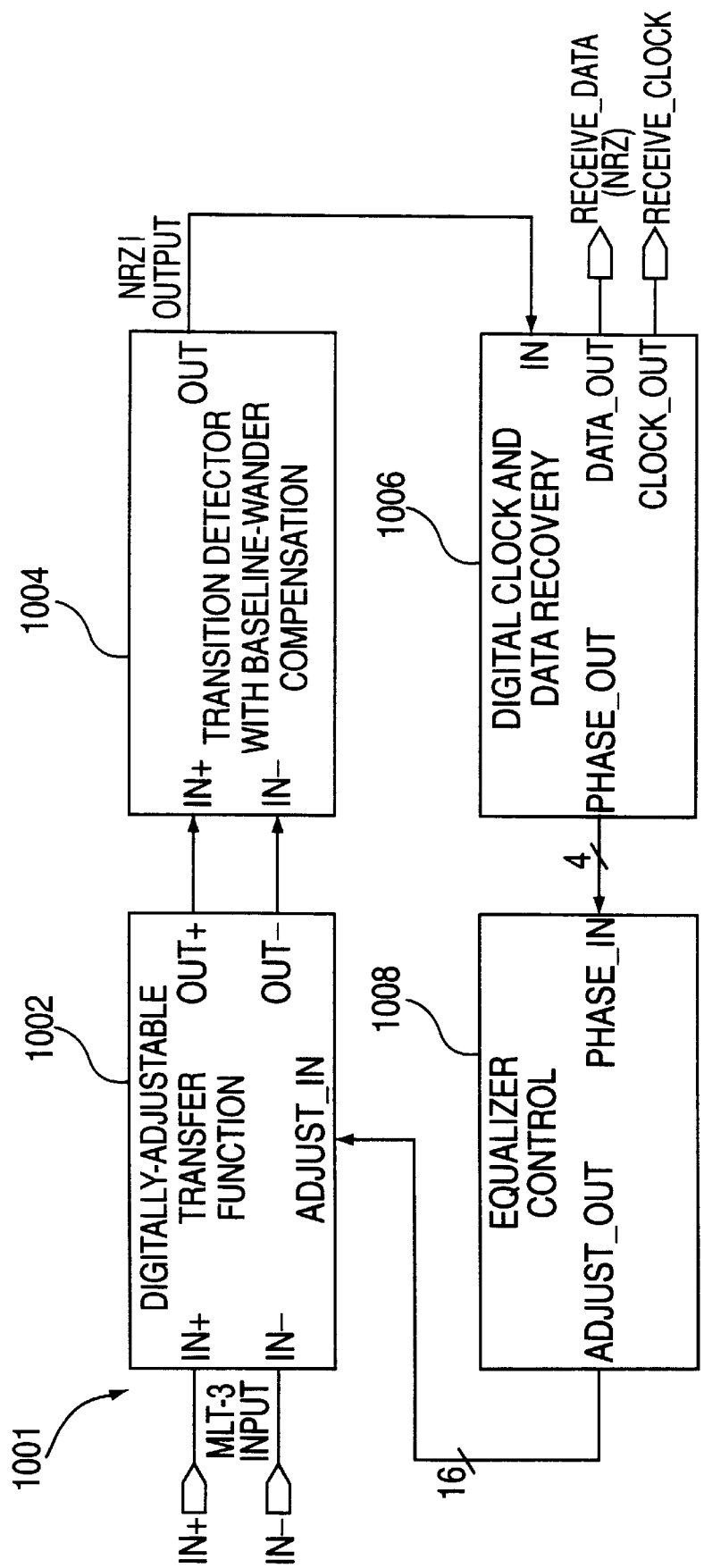
FIG. 11 shows a second exemplary embodiment of an adaptive equalizer according to the present invention.

A digitally-controlled adaptive equalizer 1001 according to the second exemplary embodiment is given by FIG. 11. An input signal, for example, an MLT-3 signal, is applied at an input of a digitally adjustable transfer function block 1002. The MLT-3 signal is typically distorted due to its transmission over the 100BASE-TX network cabling. The digitally-adjustable transfer function block 1002 applies a transfer function that, when optimally adjusted, restores the input signal nearly to its undistorted form. The restored signal is applied to an input of a transition detector with baseline wander compensation block 1004, where the restored signal is compensated for any baseline wander and converted into, for example, a two-level NRZI signal. Transition detector with baseline wander compensation block 1004 is implemented, for example, as described in the aforementioned U.S. patent application Ser. No. 08/764,720.

The two-level NRZI signal is applied to an input of digital clock and data recovery block 1006, which produces a recovered signal by extracting the embedded clock and data information from the NRZI signal. This information is provided at a clock output and a data output (respectively) of the digital clock and data recovery block 1006, such that this information is available to downstream circuits and functions. The digital clock and data recovery block 1006 also determines the phase of each signal transition, for example, as a four bit digital quantity, and provides this phase information at a phase output. The phase output is coupled to a phase input of an equalizer control block 1008, such that the equalizer control block 1008 may use this information to adjust the transfer function of digitally-adjustable transfer function block 1002. Specifically, the phase information is used to calculate the jitter between signal transitions, and the equalizer control block 1008 digitally adjusts the transfer function (via a 16-bit digital adjustment signal provided to digitally-adjustable transfer function block 1002) until the measured jitter is minimized according to the previously described processes.

By virtue of the feedback control loop formed by the digitally-adjustable transfer function block 1002, the transition detector with baseline wander compensation block 1004, the digital clock and data recovery block 1006 and the equalizer control block 1008, the digital adaptive equalizer 1001 becomes adapted such that the equalizer transfer function is optimally matched to the cable characteristics, regardless of length.

Figure 12:
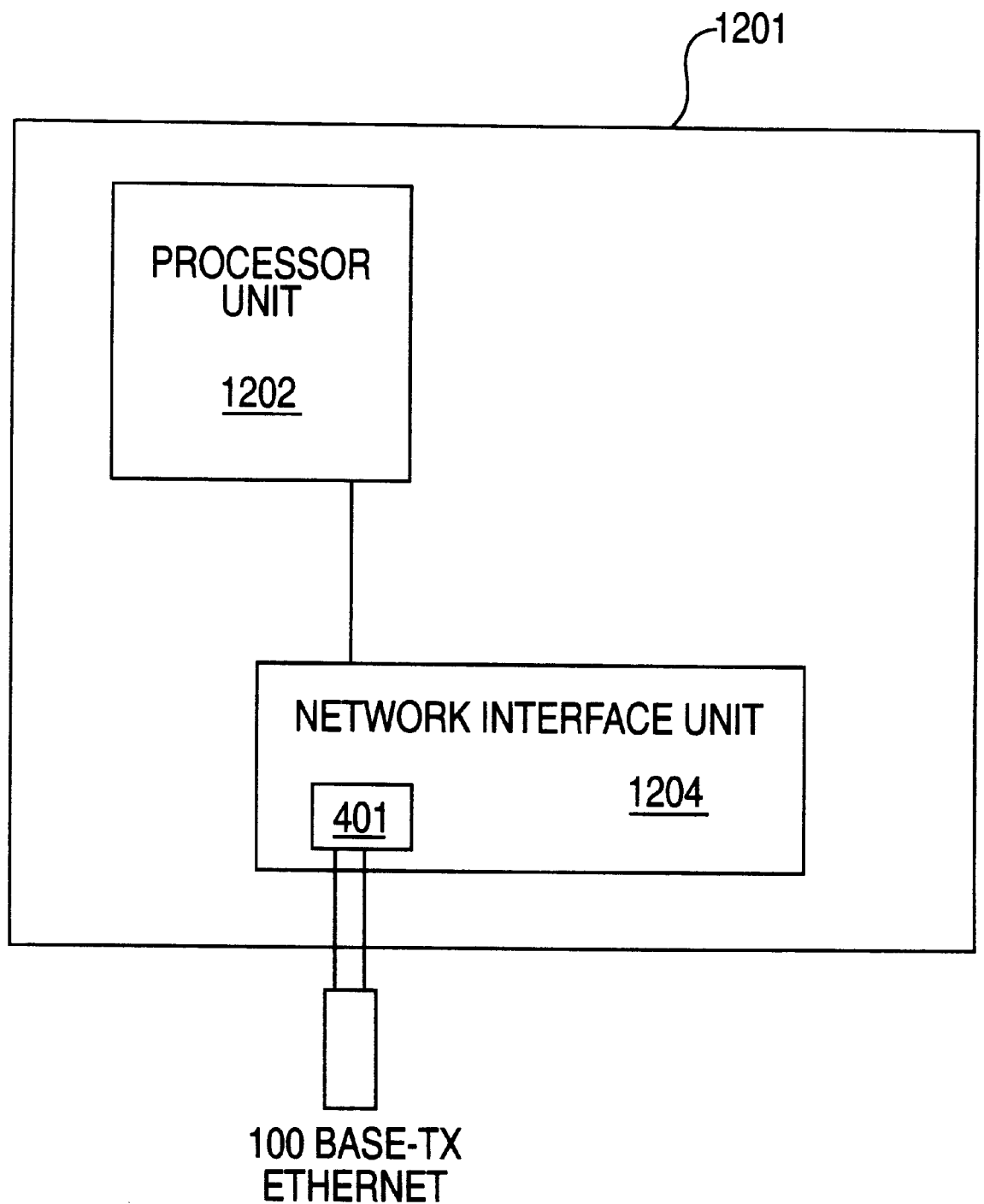
FIG. 12 shows a computer system incorporating an adaptive equalizer according to the present invention.

The adaptive equalizer of the present invention may be implemented as part of a computer system 1201, as shown in FIG. 12. Computer system 1201 includes a processor unit 1202 (e.g. a microprocessor with supporting hardware) and a network interface unit 1204 for establishing communication over, for example, a 100BASE-TX Fast Ethernet network. Processor unit 1202 is coupled to network interface unit 1204 to, for example, provide data to, and receive date from, the network. As part of network interface unit 1204, either previously described embodiment of adaptive equalizer according to the present invention may be incorporated (adaptive equalizer 401 is depicted in FIG. 12) to perform equalization of signals received over the network.

Although the present invention has been described with respect to specific exemplary embodiments, various changes and modifications may be suggested to one skilled in the art. For example, it may be contemplated to implement part or all of the present invention as a hardware circuit, microcode, programmable logic, and/or software. The present invention is intended to encompass these and other changes and modifications as fall within the scope of the appended claims.

What is claimed is:

1. An adaptive equalizer, comprising:
    a variable filter having an input to receive an input signal and an adjustable transfer function to produce a filtered signal based on the input signal;
    a detector coupled to the variable filter to receive the filtered signal and produce a decoded signal based on the filtered signal;
    a clock and data recovery unit coupled to the detector to receive the decoded signal and produce a recovered signal based on the decoded signal; and
    an adaptation control unit coupled to the clock and data recovery unit to receive the recovered signal, and coupled to the variable filter to provide an adjustment signal according to a determination of jitter of the filtered signal.

2. The adaptive equalizer of claim 1, wherein the adjustment signal is a digital signal.

3. The adaptive equalizer of claim 1, wherein the recovered signal includes a transition data signal, and the transition data signal is provided to the adaptation control unit.

4. The adaptive equalizer of claim 1, wherein the recovered signal includes a clock signal and a data signal.

5. The adaptive equalizer of claim 1, wherein the transfer function has a frequency response characteristic, and is implemented as a filter including a variable resistor.

6. The adaptive equalizer of claim 5, wherein the adjustment signal is applied to specify a resistance value of the variable resistor.

7. The adaptive equalizer of claim 1, wherein the adjustable transfer function has a frequency response characteristic and is implemented as at least one first-order lead-lag filter, and wherein the at least one filter includes a variable resistor, and wherein the adjustment signal is applied to set a resistance value of the variable resistor to affect the frequency response characteristic.

8. The adaptive equalizer of claim 1, wherein the filtered signal is an analog signal, and the decoded signal and the recovered signal are digital signals.

9. The adaptive equalizer of claim 1, wherein the input signal is an MLT-3 signal, the filtered signal is an MLT-3 signal, and the decoded signal is an NRZI signal.

10. The adaptive equalizer of claim 9, wherein the detector performs MLT-3 to NRZI conversion to produce the decoded signal.

11. The adaptive equalizer of claim 1, further comprising a symbol error detector coupled to the clock and data recovery unit to receive the recovered signal and produce a symbol error signal when an error condition exists in the recovered signal.

12. The adaptive equalizer of claim 11, wherein the symbol error detector is coupled to the adaptation control unit to provide the symbol error signal, and wherein the adaptation control unit performs an adaptation process when the symbol error signal is asserted.

13. The adaptive equalizer of claim 1, wherein the variable filter, detector, clock and data recovery unit and adaptation control unit are implemented in a network physical interface device.

14. A method for adaptive equalization, comprising the steps of:
    receiving an input signal;
    applying a transfer function to the input signal to produce a filtered signal;
    decoding the filtered signal to produce a decoded signal;
    producing a recovered signal based on the decoded signal;
    determining jitter based on the recovered signal;
    producing an adjustment signal based on the jitter; and
    applying the adjustment signal to the transfer function to cause response adjustment of the transfer function.

15. The method of claim 14, wherein the adjustment signal is a digital signal.

16. The method of claim 14, wherein the input signal and the filtered signal are analog signals, and the decoded signal and the recovered signal are digital signals.

17. The method of claim 14, wherein the recovered signal includes a transition data signal, a clock signal and a data signal.

18. The method of claim 17, wherein the transition data signal includes at least one of transition location information and a number of transitions in each clock period.

19. The method of claim 14, further comprising the step of:

adjusting the transfer function based on a comparison of an equalizer normal operating range to a clock-to-transition ratio of the recovered signal.

20. The method of claim 14, further comprising the step of:

adjusting the transfer function by repeatedly stepping the adjustment signal by one unit until jitter has been minimized.

21. A network physical interface device, comprising:

an input to receive an input signal;

an equalization unit, comprising a variable filter operatively coupled to the input and including a transfer function having a frequency response characteristic to produce a filtered signal based on the input signal, a decoding detector operatively coupled to the variable filter to receive the filtered signal and produce a decoded signal based on the filtered signal, a clock and data recovery unit operatively coupled to the decoding detector to receive the decoded signal and produce a recovered signal, including at least one of a clock signal, a data signal and a transition data signal, an adaptation control unit operatively coupled to the clock and data recovery unit to receive the recovered signal and produce a digital adjustment signal based on jitter, as determined from the recovered signal, and further coupled to the variable filter to provide the digital adjustment signal, wherein the digital adjustment signal is applied to the transfer function to adjust the frequency response characteristic of the transfer function; and an output to output the recovered signal.

22. The network physical interface device of claim 21, wherein the digital adjustment signal is at least two bits wide.

23. The network physical interface device of claim 21, wherein the transfer function includes a variable resistor structure, and the digital adjustment signal is applied to the variable resistor structure to set the resistance level.

24. The network physical interface device of claim 21, wherein the equalization unit further comprises a baseline wander compensation unit.

25. A computer, comprising:

a processor; and a network interface unit coupled to the processor and including an adaptive equalizer, the adaptive equalizer comprising a variable filter having an input to receive an input signal and an adjustable transfer function to produce a filtered signal based on the input signal;

a detector coupled to the variable filter to receive the filtered signal and produce a decoded signal based on the filtered signal;

a clock and data recovery unit coupled to the detector to receive the decoded signal and produce a recovered signal based on the decoded signal; and an adaptation control unit coupled to the clock and data recovery unit to receive the recovered signal, and coupled to the variable filter to provide an adjustment signal according to a determination of jitter of the filtered signal.

* * * * *